United States Patent
Belluomini et al.

(10) Patent No.: US 6,690,204 B1
(45) Date of Patent: Feb. 10, 2004

(54) LIMITED SWITCH DYNAMIC LOGIC CIRCUIT

(75) Inventors: Wendy A. Belluomini, Austin, TX (US); Robert K. Montoye, Austin, TX (US); Hung C. Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/242,214

(22) Filed: Sep. 12, 2002

(51) Int. Cl.[7] ................... H03K 19/096; H03K 19/20
(52) U.S. Cl. .......................... 326/95; 326/112
(58) Field of Search .................. 326/95, 98, 94, 326/112, 119, 121

(56) References Cited

U.S. PATENT DOCUMENTS

| | | | | |
|---|---|---|---|---|
| 6,104,212 A | * | 8/2000 | Curran | 326/95 |
| 6,265,897 B1 | * | 7/2001 | Poirier et al. | 326/93 |
| 6,316,960 B2 | * | 11/2001 | Ye | 326/95 |
| 6,437,602 B1 | * | 8/2002 | Friend et al. | 326/93 |

OTHER PUBLICATIONS

FIGURE—Alliance 97, Mux Latch, one page., 1997.
Durham–IBM, Figure—The 630FP Approach to Clocking and Latching, Domino Mid–Cycle Latch (DMCL), ARL Clocking & Latch Workshop, Mar. 18–20 1997, p.16.

Sigal et al., "Circuit design techniques for the high–performance CMOS IBM S/390 Parallel Enterprise Server G4 microprocessor," *IBM J. Res. Develop*, vol. 41, No. 4/5, Jul./Sep. 1997, pp. 489–501.

* cited by examiner

*Primary Examiner*—James Cho
(74) *Attorney, Agent, or Firm*—Richard F. Frankeny; Winstead Sechrest & Minick P.C.; Casimer L. Salys

(57) ABSTRACT

Circuits and systems for producing a static switching factor on the output lines of dynamic logic devices. A logic device having a plurality of dynamic logic circuits each performing a Boolean function on a plurality of inputs and generating an output on a dynamic node. The corresponding plurality of dynamic outputs are coupled to a static logic circuit which performs an additional Boolean function of the plurality of dynamic outputs. The static logic circuit operates to generate an output logic state that is maintained so long as the value of the Boolean operations being performed by the logic device do not change. Additionally, static logic elements may perform the inversions necessary to output both logic senses, mitigating the need to provide for dual-rail dynamic logic implementations. An asymmetric clock permits a concomitant decrease in the size of the precharge transistors, thus ameliorating the area required by the logic element.

24 Claims, 9 Drawing Sheets

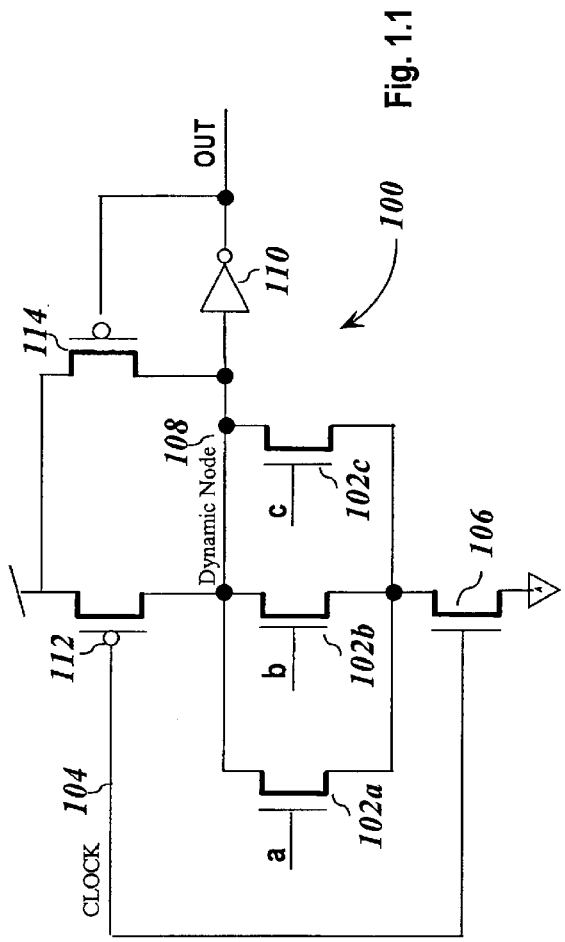
Fig. 1.1
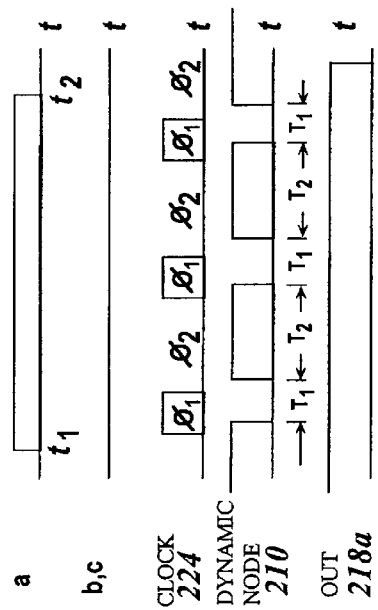
Fig. 2.3
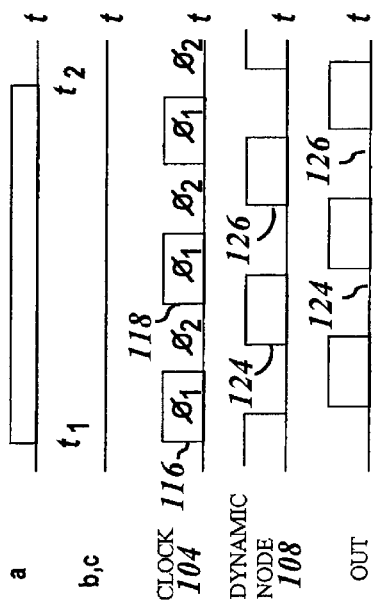
Fig. 1.2

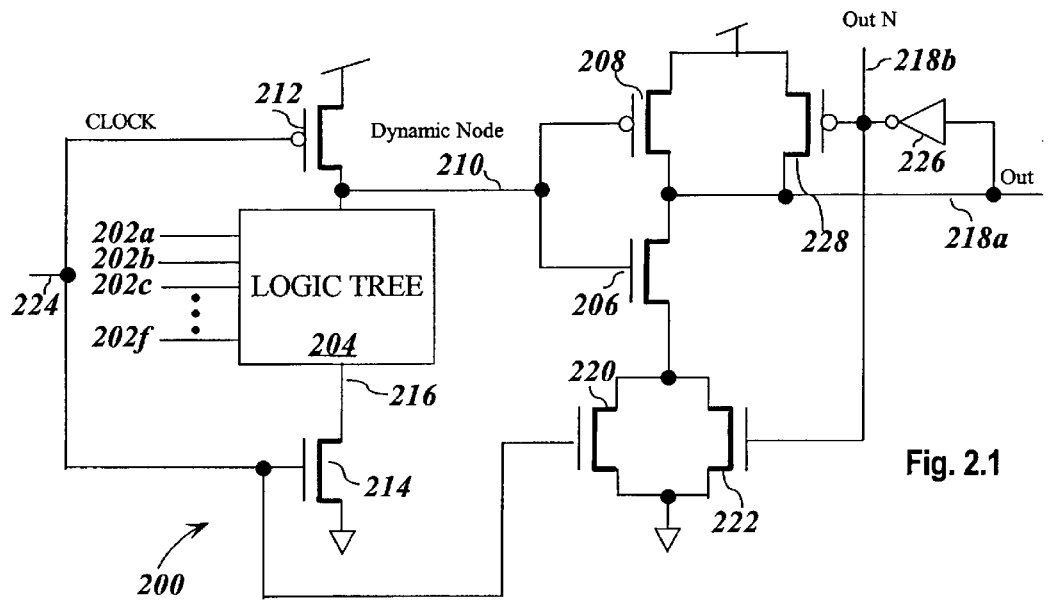
Fig. 2.1
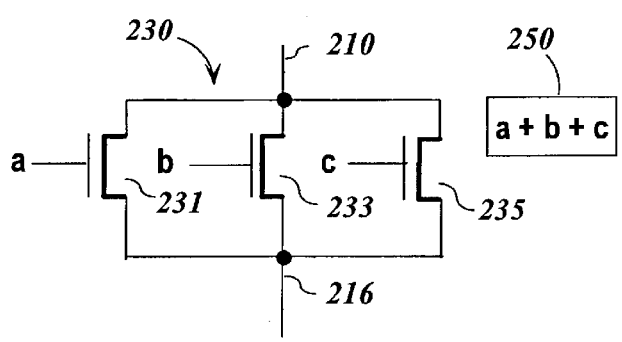
Fig. 2.2.1
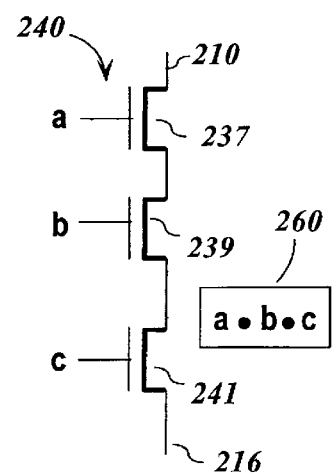
Fig. 2.2.2

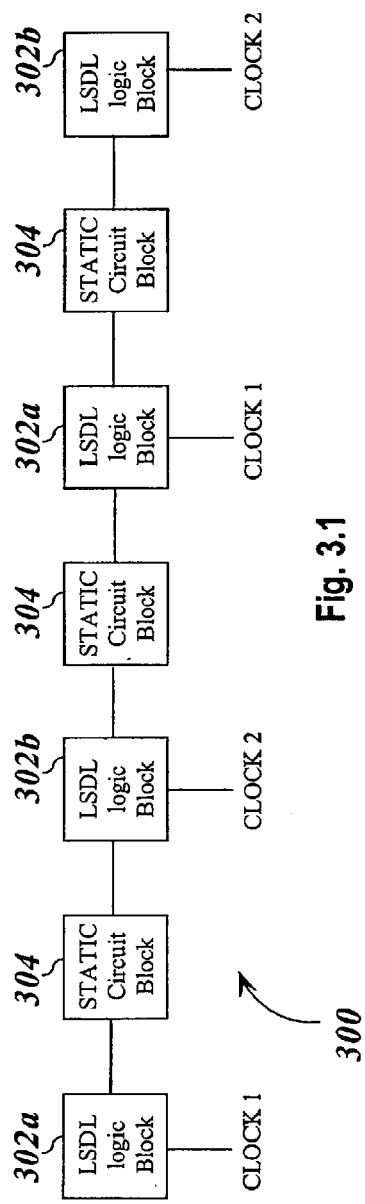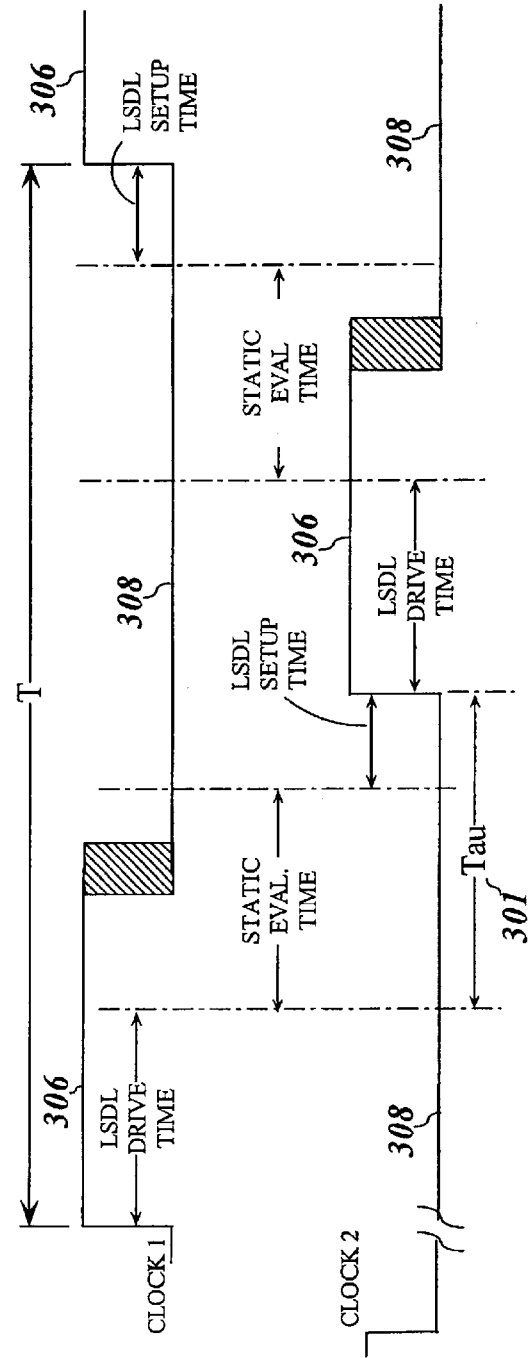
Fig. 3.1
Fig. 3.2

US 6,690,204 B1

LIMITED SWITCH DYNAMIC LOGIC CIRCUIT

CROSS REFERENCE TO RELATED APPLICATION

The present invention is related to the following U.S. Patent Applications and which are incorporated by reference:

Ser. No. 10/116,612 filed Apr. 4, 2002 entitled, "Circuits And Systems For Limited Switch Dynamic Logic;" and Ser. No. 10/247,236 filed Sep. 12, 2002 entitled "Limited Switch Dynamic Logic Selector Circuits" filed concurrently herewith.

TECHNICAL FIELD

The present invention relates to dynamic logic circuits, and in particular, to dynamic logic circuits having a dynamic switching factor to reduce power consumption.

BACKGROUND INFORMATION

Modern data processing systems may perform Boolean operations on a set of signals using dynamic logic circuits. Dynamic logic circuits are clocked. During the precharge phase of the clock, the circuit is preconditioned, typically, by precharging an internal node (dynamic node) of the circuit by coupling to a power supply rail. During an evaluate phase of the clock, the Boolean function being implemented by the logic circuit is evaluated in response to the set of input signal values appearing on the inputs during the evaluate phase. (For the purposes herein, it suffices to assume that the input signals have settled to their "steady-state" values for the current clock cycle, recognizing that the input value may change from clock cycle to clock cycle.) Such dynamic logic may have advantages in both speed and the area consumed on the chip over static logic. However, the switching of the output node with the toggling of the phase of the clock each cycle may consume power even when the logical value of the output is otherwise unchanged.

This may be appreciated by referring to FIG. 1.1 illustrating an exemplary three-input OR dynamic logic gate, and the accompanying timing diagram, FIG. 1.2. Dynamic logic 100, FIG. 1.1, includes three inputs a, b and c coupled to a corresponding gate of NFETs 102a–102c. During an evaluate phase of clock 104, $N_1$, NFET 106 is active, and if any of inputs a, b or c are active, dynamic node 108 is pulled low, and the output OUT goes "high" via inverter 110. Thus, referring to FIG. 1.2, which is illustrative, at $t_1$ input a goes high during a precharge phase $N_2$ of clock 104. During the precharge phase $N_2$ of clock 104, dynamic node 108 is precharged via PFET 112. Half-latch PFET 114 maintains the charge on dynamic node 108 through the evaluate phase, unless one or more of inputs a, b or c is asserted. In the illustrative timing diagrams in FIG. 1.2, input a is "high" having a time interval $t_1$, through $t_2$ that spans approximately 2½ cycles of clock 104, which includes evaluation phases, 116 and 118. Consequently, dynamic node 108 undergoes two discharge-precharge cycles, 124 and 126. The output node similarly undergoes two discharge-precharge cycles, albeit with opposite phase, 124 and 126. Because the output is discharged during the precharge phase of dynamic node 108, even though the Boolean value of the logical function is "true" (that is, "high" in the embodiment of OR gate 100) the dynamic logic dissipates power even when the input signal states are unchanged.

Additionally, dynamic logic may be implemented in a dual rail embodiment in which all of the logic is duplicated, one gate for each sense of the data. That is, each logic element includes a gate to produce the output signal, and an additional gate to produce its complement. Such implementations may exacerbate the power dissipation in dynamic logic elements, as well as obviate the area advantages of dynamic logic embodiments.

Limited switching dynamic logic (LSDL) circuits produce circuits which mitigate the dynamic switching factor of dynamic logic gates with the addition of static logic devices which serve to isolate the dynamic node from the output node. Co-pending U.S. Patent Application entitled, "CIRCUITS AND SYSTEMS FOR LIMITED SWITCH DYNAMIC LOGIC," Ser. No. 10/116,612 filed Apr. 4, 2002 and commonly owned, recites such circuits. Additionally, LSDL circuits and systems maintain the area advantage of dynamic logic over static circuits, and further provide both logic senses, that is, the output value and its complement. However, the logic tree that is the heart of dynamic logic and in particular LSDL circuits have a limit to the fan-in for the logic function. Therefore, there is a need for LSDL circuits that allow a larger fan-in for logic functions. In standard LSDL circuits, the static logic devices which serve to isolate the dynamic node perform only an inverting function between its input and output. Therefore, there is a need for the static logic devices in LSDL to form more complex logic functions while maintaining the advantages of a standard LSDL circuit.

SUMMARY OF THE INVENTION

The aforementioned needs are addressed by the present invention. Accordingly, there is a limited switch dynamic logic (LSDL) circuit configuration with a plurality of dynamic logic circuits each having a corresponding dynamic node, and a plurality of logic input signals, wherein each dynamic node has a precharge value during a first phase of a clock signal and an asserted value corresponding to a Boolean combination of its corresponding plurality of input signals during the second phase of the clock signal. The plurality of dynamic nodes are further coupled to a static logic section which further generates an output and complement output of the LSDL circuit that is the value corresponding to a final Boolean combination of the asserted values of the dynamic logic gates. The static logic section is configured to combine the outputs of the plurality of dynamic logic gates performing the final Boolean function on logic values of the dynamic nodes during the first phase of the clock signal and holding the value of the final Boolean function during the second phase of the clock signal.

Additionally, there are provided logic systems and circuits including a plurality of LSDL circuits for asserting Boolean functions of a plurality of input signals, in which a signal on a first node asserted in response to a first phase of a clock signal constitutes a plurality of Boolean combinations of the plurality of input signals. Also included is a static portion coupled to the first node. The static portion is configured to combine the outputs of the dynamic logic portions while maintaining an output value of the logic device during a second phase of the clock signal; the output value represents a total Boolean function performed by the dynamic portions and the static portion. Also, a duration of the first phase of the clock signal is less than a duration of the second phase of the clock signal.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings in which:

FIG. 1.1 illustrates, in partial schematic form, a dynamic logic gate which may be used in conjunction with the present invention;

FIG. 1.2 illustrates a timing diagram corresponding to the logic gate embodiment illustrated in FIG. 1.1;

FIG. 2.1 illustrates, in partial schematic form, a standard LSDL device illustrating the static logic devices for isolating the dynamic node from the output node;

FIG. 2.2.1 illustrates, in partial schematic form, circuitry for incorporation in the logic tree of FIG. 2.1 whereby the logic function performed is the logical OR of three input signals;

FIG. 2.2.2 illustrates, in partial schematic form, another circuit for incorporation in the logic tree of FIG. 2.1 whereby the logic function performed is the logical AND of three input signals;

FIG. 2.3 illustrates a timing diagram corresponding to an embodiment of the dynamic logic device of FIG. 2.1 in which the logic function performed is the logical OR of three input signals;

FIG. 3.1 illustrates, in block diagram form, a limited switch dynamic logic system in accordance with an embodiment of the present invention;

FIG. 3.2 illustrates a two-phase clock which may be used in conjunction with the logic system of FIG. 3.1;

DETAILED DESCRIPTION

Figure 4:
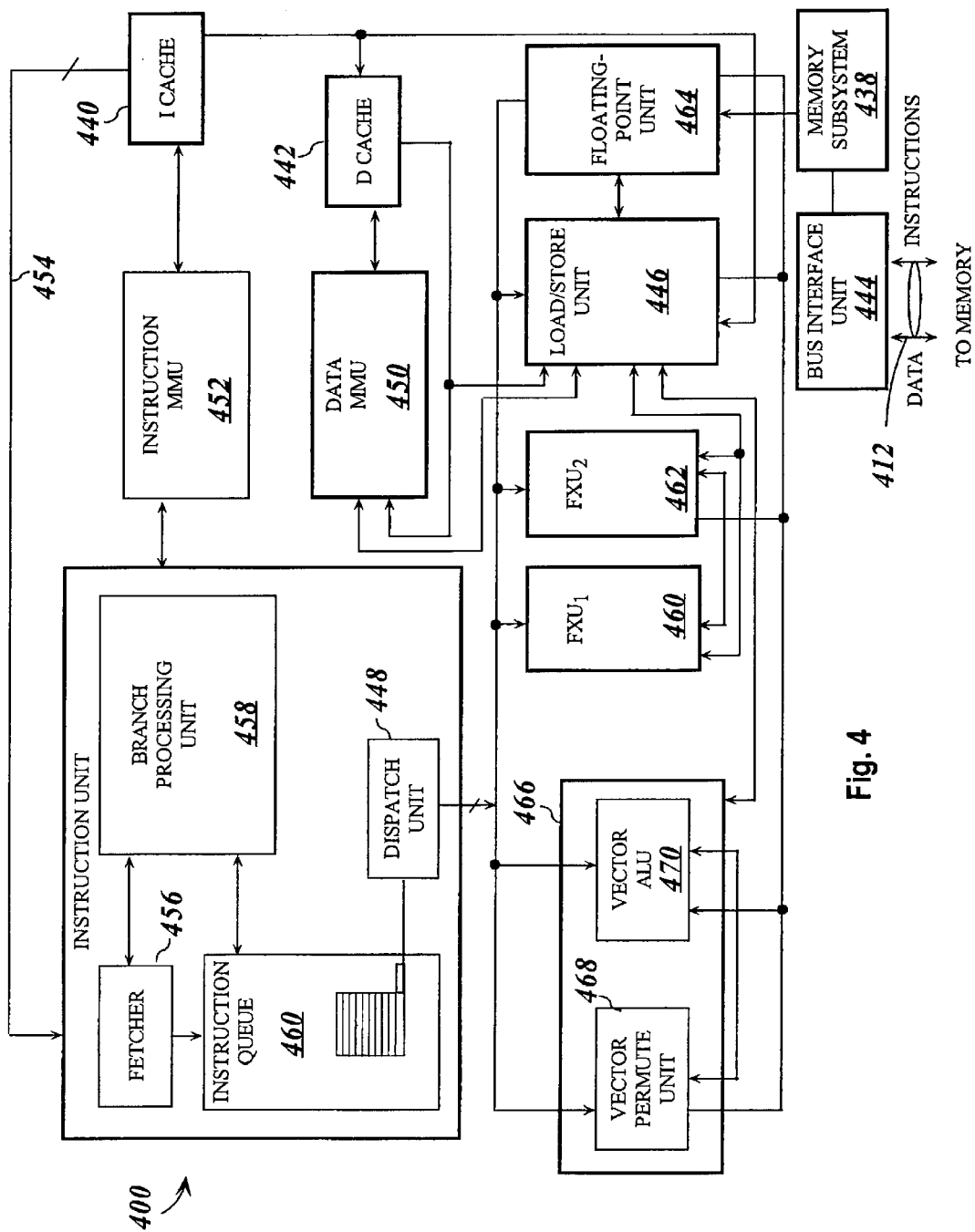
FIG. 4 illustrates a high level block diagram of selected operational blocks within a central processing unit (CPU) incorporating the present inventive principles.

In the following description, numerous specific details are set forth to provide a thorough understanding of the present invention. For example, specific logic functions and the circuitry for generating them may be described; however, it would be recognized by those of ordinary skill in the art that the present invention may be practiced without such specific details. In other instances, well-known circuits have been shown in block diagram form in order not to obscure the present invention in unnecessary detail. Refer now to the drawings wherein depicted elements are not necessarily shown to scale and wherein like or similar elements are designated by the same reference numeral by the several views.

FIG. 2.1 illustrates a limited switch dynamic logic (LSDL) device 200 used in accordance with the present inventive principles. In general, LSDL device 200 receives a plurality, n, of inputs 202a . . . 202d provided to logic tree 204, and outputs a Boolean combination of the inputs. The particular Boolean function performed by LSDL device 200 is reflected in the implementation of logic tree 204 (accounting for the inversion performed by the inverter formed by n-channel field effect transistor (NFET) 206 and p-channel field effect transistor (PFET) 208). Logic tree 204 is coupled between the drain of PFET 212 and the drain of NFET 214, node 216. The junction of the logic tree 204 and the drain of PFET 212 forms dynamic node 210.

For example, FIG. 2.2.1 illustrates logic tree 230 including three parallel connected NFETs, 231, 233 and 235. Logic tree 230 may be used to provide a logic device generating the logical NOR of the three input signals coupled to corresponding ones of the gates of NFETs 231, 233 and 235, a, b and c (as indicated by the Boolean expression 250 in FIG. 2.2.1) and accounting for the inversion via NFET 206 and PFET 208. Similarly, FIG. 2.2.2 illustrates a logic tree 240 including three serially connected NFETs 237, 239 and 241. Logic tree 240 may be used in conjunction with the logic device 200 to generate the logical NAND of the three input signals a, b and c (as indicated by the Boolean expression 260 in FIG. 2.2.2).

Returning to FIG. 2.2.1, dynamic node 210 is coupled to the common junction of the gates of NFET 206 and PFET 208 which invert the signal on dynamic node 210. The inversion of the signal on dynamic node 210 is provided on Out 218a. The transistor pair, 206 and 208, is serially coupled to parallel NFETs 220 and 222. NFET 220 is switched by clock signal 224. Thus, during the evaluate phase of clock signal 224, the inverter pair, NFET 206 and PFET 208 are coupled between the supply rails by the action of NFET 220.

The operation of LSDL device 200 during the evaluate phase, $N_1$, may be further understood by referring to FIG. 2.3 illustrating an exemplary timing diagram corresponding to the dynamic logic circuit of FIG. 2.1 in combination with a logic tree embodiment 230 of FIG. 2.2.1. In this way, for purposes of illustration, the timing diagram in FIG. 2.3 is the counterpart to the timing diagram in FIG. 1.2 for the three-input OR gate 100 depicted in FIG. 1.1. As shown, input a is "high" or "true" between $t_1$ and $t_2$. In the evaluate phase, $N_1$ of clock signal 224, dynamic node 210 is pulled down (intervals $T_1$). In these intervals, Out 218a is held high by the action of the inverter formed by transistors 206 and 208, which inverter is active through the action of NFET 220 as previously described. In the intervening intervals, $T_2$, dynamic node 210 is pulled up via the action of the precharge phase, $N_2$ of clock signal 224, and PFET 212. In these intervals, the inverter is inactive as NFET 220 is off. Out 218a is held "high" by the action of inverter 226 and PFET 228. Note also that the output of inverter 226 may provide a complementary output, Out N 218b. (Thus, with respect to the three-input logic trees in FIGS. 2.2.1 and 2.2.2, the corresponding logic device represents a three-input OR gate and a three-input AND gate, respectively.)

Returning to FIG. 2.1, if the logic tree evaluates "high", that is the Boolean combination of inputs 202a . . . 202d represented by logic tree 204, evaluate high, whereby dynamic node 210 maintains its precharge, Out 218a is discharged via NFET 206 and NFET 220. In the subsequent precharge phase, $N_2$, of clock signal 224, Out 218a is latched via the action of inverter 226 and NFET 222. Thus, referring again to FIG. 2.3, corresponding to the three input OR embodiment of logic device 200 and logic tree 230 (FIG. 2.2.1) at $t_2$ input a falls, and in the succeeding evaluate phase of clock signal 224, dynamic node 210 is held high by the precharge. The inverter pair, NFETs 206 and 208, are active in the evaluate phase of $N_1$, of clock signal 224 because of the action of NFET 220. Consequently, Out 218a falls ($t_3$). In the succeeding precharge phase, $N_2$ of clock signal 224, Out 218a is latched in the "low" state, as previously described.

In this way, LSDL device 200 in FIG. 2.1, may provide a static switching factor on Out 218a, and likewise with respect to the complementary output Out N 218b. It would also be recognized by artisans of ordinary skill that although LSDL device 200, FIG. 2.1, has been described in conjunction with the particular logic tree embodiments of FIG. 2.2.1 and FIG. 2.2.2, the principles of the present invention apply to alternative embodiments having other logic tree implementations, and such alternative embodiments fall within the spirit and the scope of the present invention.

Note too, as illustrated in the exemplary timing diagram in FIG. 2.3, the duty factor of the clock signal may have a value that is less than fifty percent (50%). In such an embodiment, the evaluate phase, $N_1$, of the clock signal may be shorter in duration than the precharge phase, $N_2$. A clock signal having a duty factor less than fifty percent (50%) may be referred to as a pulse (or pulsed) clock signal. Note that a width of the evaluate phase may be sufficiently short that leakage from the dynamic node may be inconsequential. That is, leakage does not affect the evaluation of the node.

In such a clock signal embodiment, the size of the precharge device (PFET 212 in the embodiment of FIG. 2.1) may be reduced. It would be recognized by those of ordinary skill in the art that a symmetric clock signal has a fifty percent (50%) duty cycle; in an embodiment in which the duty cycle of the clock signal is less than fifty percent (50%), the size of the precharge device may be reduced concomitantly. In particular, an embodiment of the present invention may be implemented with a clock signal duty cycle of approximately thirty percent (30%). Additionally, while logic device 200 has been described from the perspective of "positive" logic, alternative embodiments in accordance with the present inventive principles may be implemented in the context of "negative" logic and such embodiments would also fall within the spirit and scope of the present invention.

Figure 6:
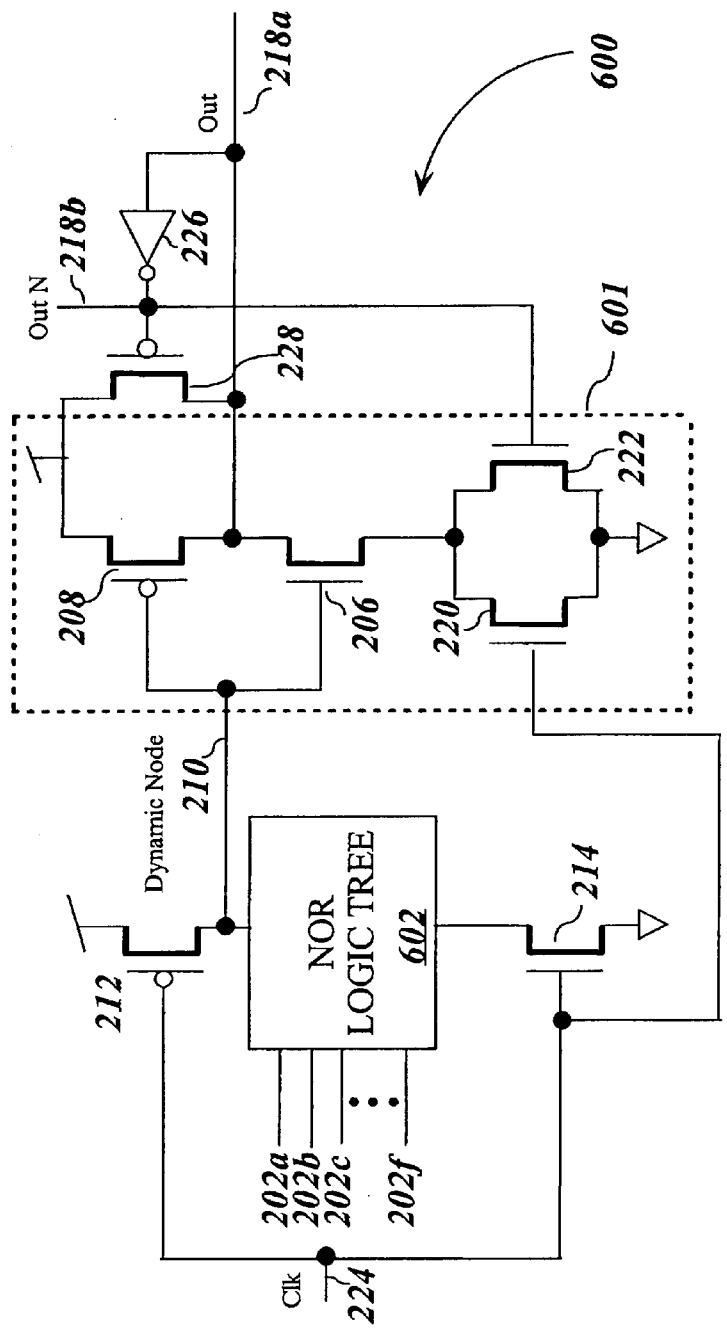
FIG. 6 is a block diagram of an LSDL circuit for expanding the logic tree using a plurality of dynamic logic circuits in conjunction with static logic devices performing an NAND logic function other than simple inversion.

FIG. 6 is an LSDL circuit (LSDL) 600 and is essentially a copy of the embodiment in FIG. 2.1 where logic tree 204 is replaced with a specific six input (202a . . . 202f) NOR logic tree 602. This specific standard LSDL 600 is used to explain embodiments of the present invention. Static logic devices 601 are highlighted to show inputs and outputs that are present in LSDL circuits configured according to embodiments of the present invention. Clock signal 224 couples to the gates of NFET 214 and PFET 212 as well as static logic devices 601. Dynamic node 210 has a logic state determined by logic tree 602 when clock signal 224 is a logic high and a precharge state when clock signal 224 is a logic low. A half latch is formed by PFET 228 and inverter 226 and is common to circuits in embodiments of the present invention. Out 218a is the logic true output of LSDL 600 and Out N 218b is the complementary output of Out 218a. NFET 222 completes the latch function on the output of LSDL 600 and is a common feedback device in circuits in embodiments of the present invention.

Figure 7:
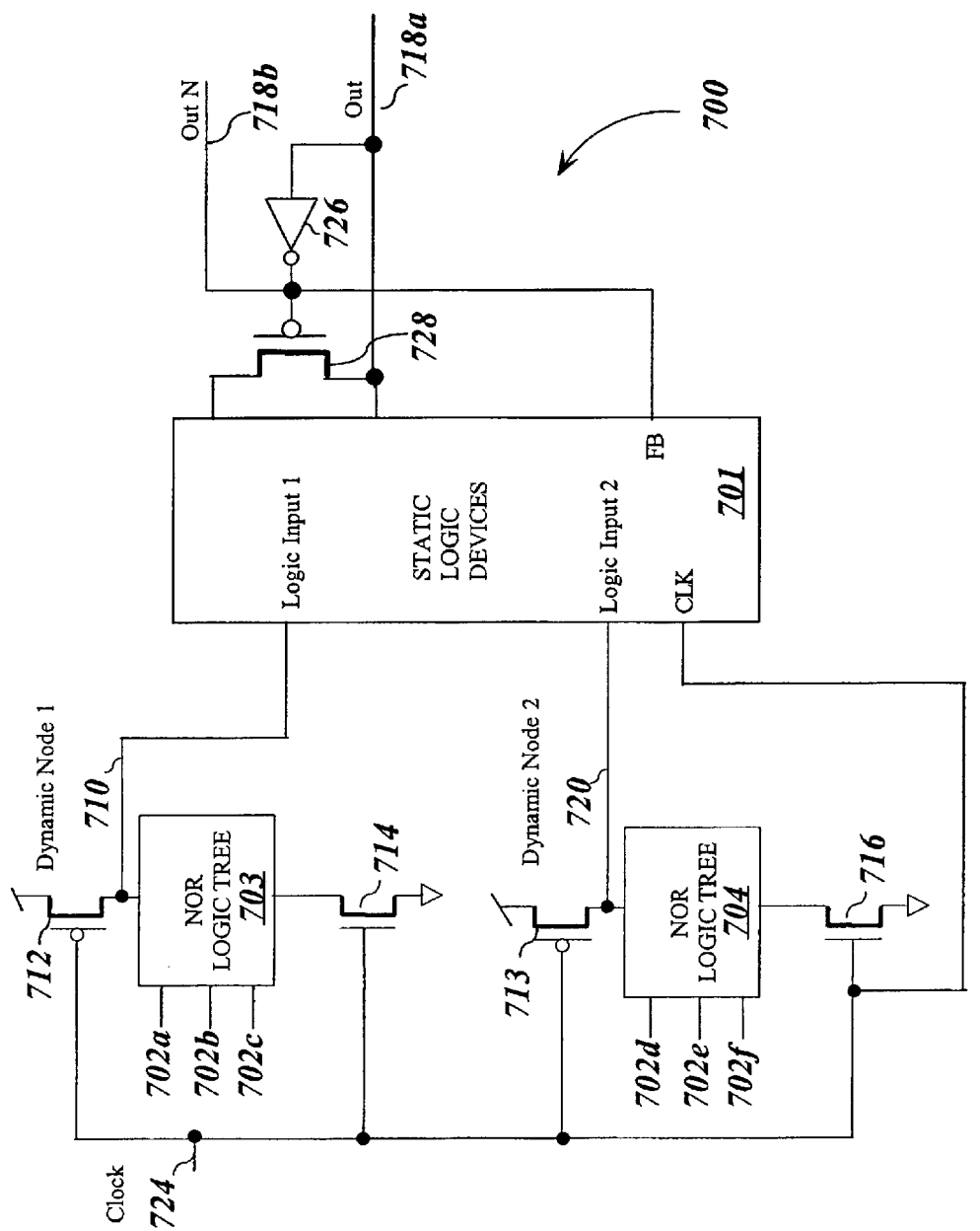
FIG. 7 is a block diagram of an LSDL circuit for expanding the logic tree using a plurality of dynamic logic circuits in conjunction with static logic devices performing a NOR logic function.

FIG. 7 is an LSDL 700 according to embodiments of the present invention which implements the function of exemplary LSDL 600. LSDL 700 implements the six input OR circuit function of exemplary LSDL 600 and is used to illustrate how the present invention overcomes limitations of the standard LSDL circuits like LSDL circuit 600. One of the objectives of the present invention is to allow a larger fan-in than may be possible with a standard LSDL circuit, like LSDL 600. In LSDL 700, the six inputs are split into two three input groups. It is understood that each input group in LSDL 700 may include the maximum number of inputs allowed in one logic tree. Three inputs are used only for illustration. In general, the number of inputs in the logic trees of LSDL 700 do not have to be equal.

In LSDL 700, logic tree 703 performs a NOR logic function as illustrated previously in FIG. 2.2.1. When clock signal 724 is a logic high, NFET 714 asserts the logic state of logic tree 703 on dynamic node (DN) 710. When clock signal 724 is a logic low, DN 710 is precharged high by PFET 712 as NFET 714 is OFF isolating logic tree 703 from DN 710. Likewise, the logic state of logic tree 704 is asserted on DN 720 when clock signal 724 is a logic high turning ON NFET 716. In the example of FIG. 7, the six inputs of LSDL 600 are split into two groups of three inputs. In general, two or more logic trees are used in embodiments of the present invention to increase the fan-in of standard LSDL logic gates. LSDL 700 has static logic devices 701 which receive more than one dynamic node (in this case two nodes, DN 710 and DN 720). Clock signal 724 is coupled to NFETS 714 and 716 as well as to static logic devices 701. As with LSDL 600, LSDL 700 generates an output (Out 718a) and a complementary output (Out N 718b). Out N 718b is fed back to static logic devices 701 to complete the latching function of PFET 728 and inverter 726.

Figure 8:
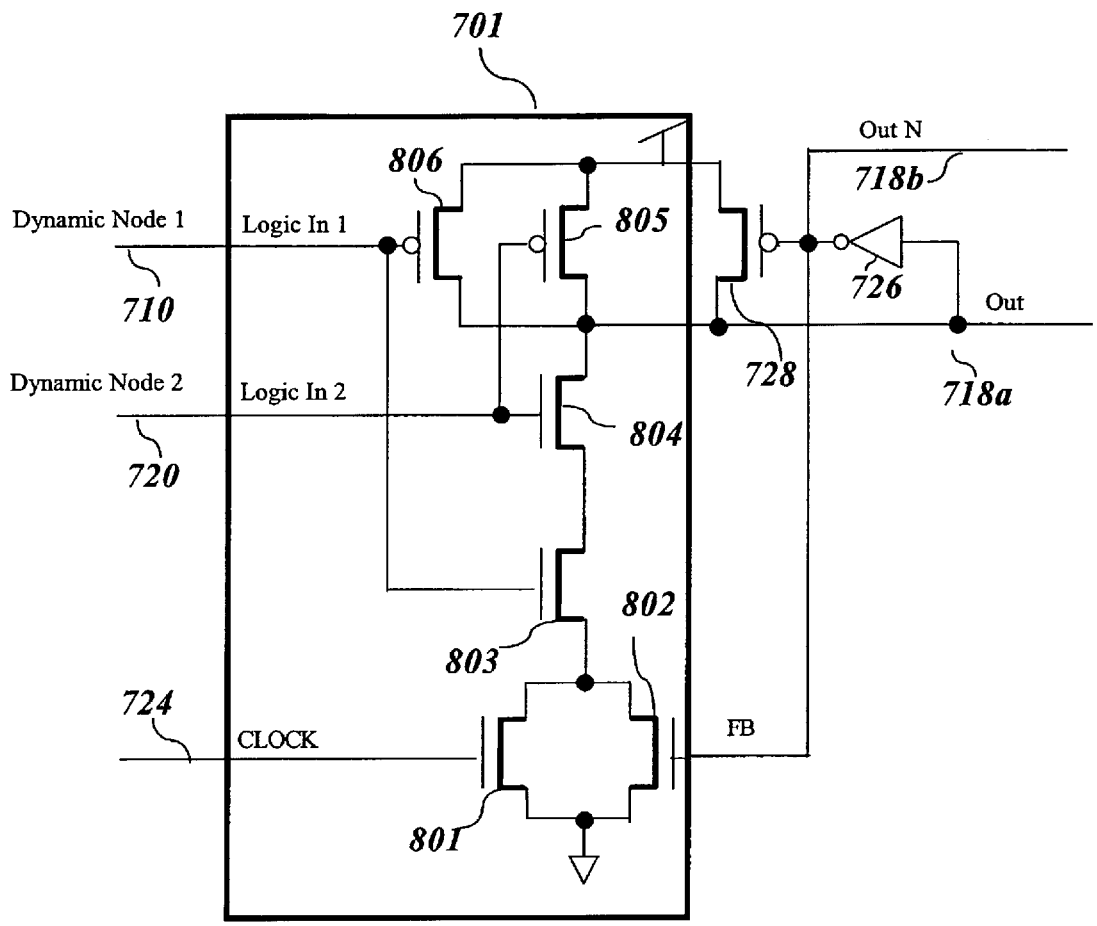
FIG. 8 is a circuit diagram detailing static logic devices in the LSDL circuit of FIG. 7.

FIG. 8 details static logic devices 701 in LSDL 700. Since exemplary LSDL 700 implements the same logic function of six input OR function of LSDL 600, static logic devices 701 must perform the logic function of a two input NAND as each dynamic node DN 710 and DN 720 performs a three input NOR function when asserted by the logic high of clock signal 724. NFET 803, NFET 804, PFET 805 and PFET 806 performs a static NAND combination on the logic values of DN 710 and DN 720. NFET 801 asserts the logic function of static logic devices 701 when clock signal 724 is a logic high and NFET 802 latches a logic low state on Out 718a when clock signal 724 is a logic low precharging both DN 710 and DN 720 to a logic high turning off both PFETS 805 and 806. In the embodiment of FIG. 8, static logic devices 701 performs a logic NAND function; however, in general the static logic devices of embodiments of the present invention may perform other static logic functions and still be within the scope of the present invention.

Figure 9:
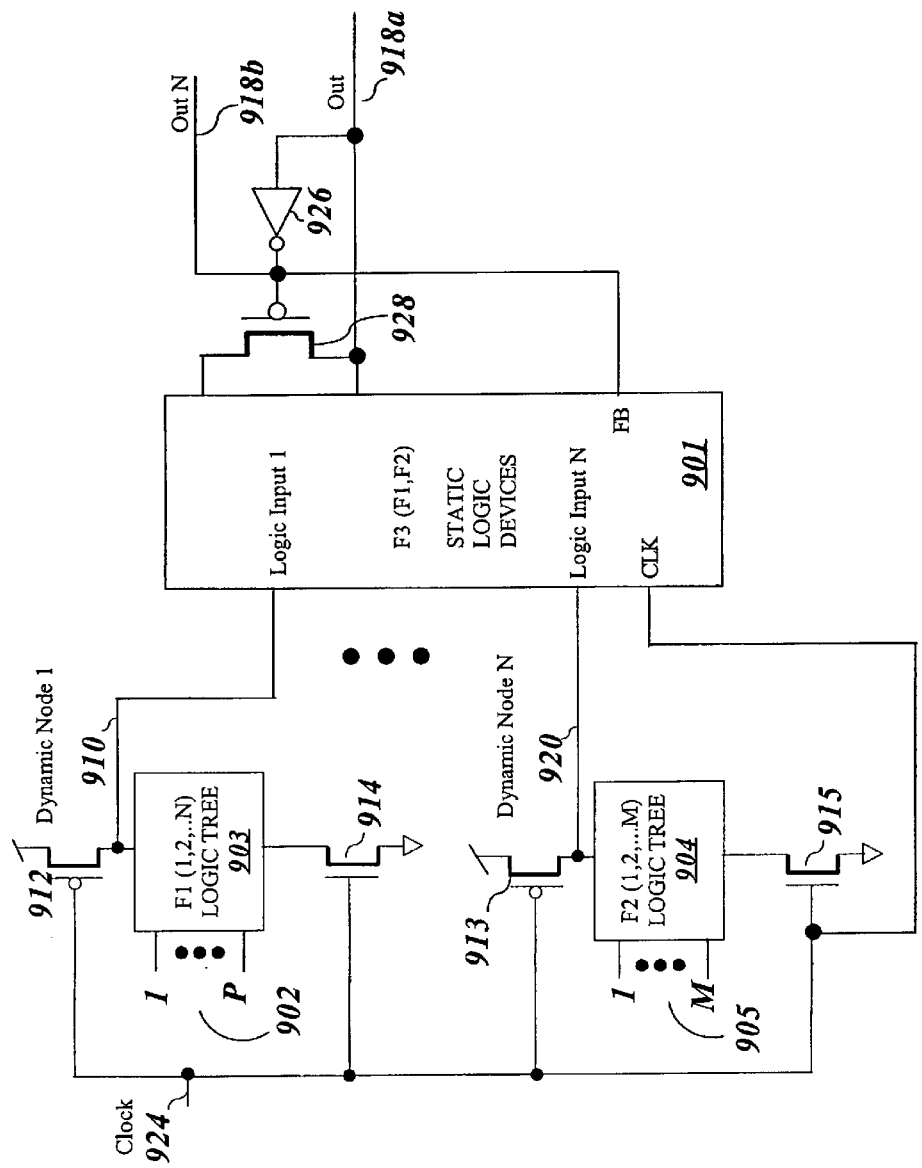
FIG. 9 is a generalized circuit diagram of an LSDL circuit according to embodiments of the present invention.

FIG. 9 is a circuit block diagram of a general LSDL 900 according to embodiments of the present invention. A plurality N of dynamic logic trees 903 through 904 have respective N outputs from DN 910 through DN 920 coupled to logic inputs of static logic devices 901. Logic tree 903 has P inputs 902 and logic tree 904 has M inputs 905. Logic tree 903 performs logic function F1(1, 2, . . . N) and logic tree 904 performs logic function F2(1, 2, . . . M). NFET 914 asserts the logic F1(1, 2, . . . N) on DN 910 when clock signal 924 is a logic high and PFET 912 precharges DN 910 to a logic high when clock signal 924 is a logic low. Likewise, NFET 915 asserts the logic F2(1, 2, . . . M) on DN 920 when clock signal 924 is a logic high and PFET 913 precharges DN 920 to a logic high when clock signal 924 is a logic low. Other dynamic logic trees (not shown) coupled to static logic devices 901 would operate in the same manner. The dynamic logic functions (e.g., F1 and F2)

coupled to static logic devices 901 are logically combined by the logic function F3 of static logic devices 901. Logic function F3 (F1, F2) is asserted when clock signal 924 is a logic high and latched to Out 918*a* and complementary Out N 918*b* by PFET 928, inverter 926 and the action of Out N 918*b* fed back to a NFET (e.g., 802) in static logic devices 901.

FIG. 3.1 illustrates a portion 300 of a data processing system incorporating LSDL circuits in accordance with the present inventive principles. System portion 300 may be implemented using a two-phase clock signal (denoted clock 1 and clock 2). A timing diagram which may be associated with system portion 300 will be discussed in conjunction with FIG. 3.2. LSDL blocks 302*b* that may be clocked by a second clock signal phase, clock 2, alternates with LSDL block 302*a* clocked by the first clock signal phase, clock 1. Additionally, system portion 300 may include static logic elements 304 between LSDL blocks. Typically, static circuit blocks 304 may include gain stages, inverters or static logic gates. Static circuit blocks 304 are differentiated from LSDL blocks 302*a* and 302*b* as they do not have dynamic nodes that have a precharge cycle. However, alternative embodiments may include any amounts of static logic. Additionally, as previously mentioned, an embodiment of system portion 300 may be implemented without static circuit blocks 304.

FIG. 3.2 illustrates a timing diagram which may correspond to logic system employing a two-phase, pulsed clock signal, such as system portion 300, FIG. 3.1, in accordance with the present inventive principles. The LSDL circuits evaluate during the LSDL evaluate, or drive, portion 306 of their respective clock signals. As previously described, the duty factor of each of clock 1 and clock 2 may be less than fifty percent (50%). The width of the LSDL drive portions 306 of the clock signals need only be sufficiently wide to allow the evaluate node (such as dynamic node 210, FIG. 2.1) to be discharged through the logic tree (for example logic tree 204, FIG. 2.1). As previously described, the duration of the drive portion may be sufficiently narrow that leakage from the evaluation may be inconsequential. Consequently, LSDL circuits are not particularly sensitive to the falling edge of the clock signals, and in FIG. 3.2, the falling portion of the evaluate phase 306 of the clock signals has been depicted with cross-hatching. As noted herein above, the duty factor of clock 1 and clock 2 may be approximately thirty percent (30%) in an exemplary embodiment of the present invention. (It would be appreciated, however, that the present inventive principles may be incorporated in alternative embodiments which have other duty factors.) During the precharge portion 308 of the clock signals, the dynamic node (for example, dynamic node 210, FIG. 2.1) is precharged, as previously discussed. Clock 2 is 180° ($\pi$ radians) out of phase with clock 1 (shifted in time one-half of period T). Thus as shown, the evaluate portion 306 of clock 2 occurs during the precharge phase 308 of clock 1. Because in LSDL circuits, the output states may not change during the evaluate phase of the driving clock signal; the inputs to LSDL blocks, for example, LSDL blocks 302*b*, FIG. 3.1, are stable during the evaluate phase of the corresponding driving clock signal, clock 2. The time interval, between the end of the evaluate portion 306 of clock 1 and the rising edge of clock 2 may be established by the setup time of the LSDL, and the evaluation time of the static blocks, if any (for example, static blocks 304, FIG. 3.1). The time, Tau 301, together with duty factor may determine the minimum clock signal period for a particular LSDL circuit implementation. Thus, a system portion 300, FIG. 3.1 having a two-phase clock signal effects two dynamic evaluations per period, T, of the driving clock signals. It would be further appreciated by those of ordinary skill in the art that, in general, the present inventive principles may be incorporated in alternative embodiments of an LSDL system having a plurality, n, of clock signal phases. Such alternative embodiments would fall within the spirit and scope of the present invention.

An LSDL system in accordance with the principles of the present invention, such as system 300, FIG. 3.1, may be used, in an exemplary embodiment, in an arithmetic logic unit (ALU). A typical ALU architecture requires a significant number of exclusive-OR (XOR) operations. The XOR of two Boolean values requires having both senses of each of the Boolean values, that is, both the value and its complement ($a \oplus b = ab' + a'b$). As previously described, use of dual rail dynamic logic to implement such functionality obviates the advantages in area and power otherwise obtained by dynamic logic. A data processing system including an ALU embodying the present inventive principles is illustrated in FIG. 4.

FIG. 4 is a high level functional block diagram of selected operational blocks that may be included in a central processing unit (CPU) 400. In the illustrated embodiment, CPU 400 includes internal instruction cache (I-cache) 440 and data cache (D-cache) 442 which are accessible to memory (not shown in FIG. 4) through bus 412, bus interface unit 444, memory subsystem 438, load/store unit 446 and corresponding memory management units: data MMU 450 and instruction MMU 452. In the depicted architecture, CPU 400 operates on data in response to instructions retrieved from I-cache 440 through instruction dispatch unit 448. Dispatch unit 448 may be included in instruction unit 454 which may also incorporate fetch unit 456 and branch processing unit 458 which controls instruction branching. An instruction queue 460 may interface fetch unit 456 and dispatch unit 448. In response to dispatched instructions, data retrieved from D-cache 442 by load/store unit 446 can be operated upon by one of fixed point unit (FXU) 460, FXU 462 or floating point execution unit (FPU) 464. Additionally, CPU 400 provides for parallel processing of multiple data items via vector execution unit (VXU) 466. VXU 466 includes vector permute unit 468 which performs permutation operations on vector operands, and vector arithmetic logic unit (VALU) 470 which performs vector arithmetic operations, which may include both fixed-point and floating-point operations on vector operands. VALU 470 may be implemented using LSDL in accordance with the present inventive principles, and in particular may incorporate LSDL logic systems, of which LSDL system 300, FIG. 3.1 is exemplary.

Figure 5:
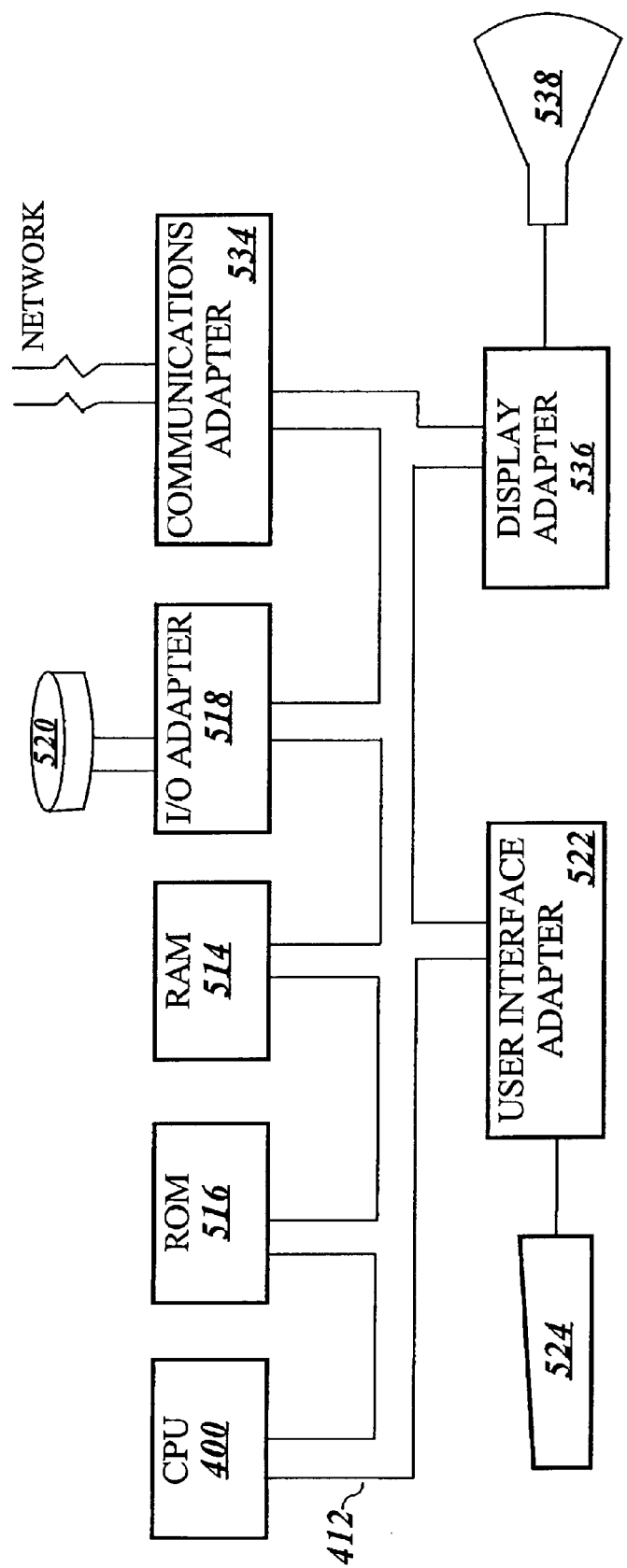
FIG. 5 illustrates a data processing system configured in accordance with the present invention.

A representative hardware environment 500 for practicing the present invention is depicted in FIG. 5, which illustrates a typical hardware configuration of a data processing system in accordance with the subject invention having CPU 400, incorporating the present inventive principles, and a number of other units interconnected via system bus 412. The data processing system shown in FIG. 5 includes random access memory (RAM) 514, read only memory (ROM) 516, and input/output (I/O) adapter 518 for connecting peripheral devices such as disk units 520 to bus 412, user interface adapter 522 for connecting keyboard 524, mouse 526, and/or other user interface devices such as a touch screen device (not shown) to bus 412, communication adapter 534 for connecting the system to a data processing network, and display adapter 536 for connecting bus 412 to display device 538. Note that CPU 400 may reside on a single integrated circuit.

Although the present invention and its advantages have been described in detail, it should be understood that various changes, substitutions and alterations can be made herein without departing from the spirit and scope of the invention as defined by the appended claims.

What is claimed is:

1. A logic device comprising:
 a plurality of dynamic logic circuits, each of said plurality of dynamic logic circuits generating a first logic output on a dynamic node, thereby forming a plurality of said dynamic nodes with a plurality of said first logic outputs, each of said plurality of said dynamic nodes precharged to a first logic value during a first phase of a clock signal and evaluated to a second logic value corresponding to a first Boolean combination of a plurality of logic input signals during a second phase of said clock signal; and
 a static logic circuit generating a second logic output at a first output node with a third logic value corresponding to a second Boolean combination of said plurality of first logic outputs during said second phase of said clock signal and maintaining said third logic value during said first phase of said clock signal.

2. The logic device of claim 1, wherein said static logic circuit generates a third logic output at a second output node having a fourth logic value corresponding to a complement of said third logic value during said second phase of said clock signal and said static logic circuit maintains said fourth logic value during said first phase of said clock signal.

3. The logic device of claim 2, wherein said static logic circuit comprises:
 a static complementary logic gate having a plurality of input nodes, each of said plurality of input nodes coupled to a corresponding one of said plurality of first logic outputs, an output node coupled to said second output node, a power supply node coupled to a first power supply voltage and a ground node coupled to a first common node of parallel coupled first and second N-channel field effect transistors (NFETs), a second common node of said parallel coupled first and second NFETs, said second common node coupled to a second power supply voltage, a gate of said first NFET coupled to said clock signal and a gate of said second NFET coupled to said second output node.

4. The logic device of claim 2 further including an inverter, an input of said inverter coupled to said first output node, an output of the inverter forming said second output node, and wherein a gate of a P-channel field effect transistor (PFET) is coupled to said output of said inverter, a source of said PFET is coupled to said power supply voltage and a drain of said PFET is coupled to said first output node.

5. The logic device of claim 1, wherein each dynamic logic circuit includes a PFET having a gate coupled to said clock signal, a source coupled to a first power supply voltage and a drain coupled to said dynamic node, and wherein a duration of said first phase of said clock signal is less than a duration of said second phase of said clock signal, and wherein said duration of the first phase of said clock signal is selected such that a leakage from each of said plurality of dynamic nodes does not affect an evaluation of each of said plurality of dynamic nodes.

6. The logic device of claim 1, wherein each of said plurality of dynamic logic circuits comprises a logic tree thereby forming a plurality of logic trees, each of said plurality of logic trees receiving said plurality of logic input signals and performing said Boolean combination on said plurality of logic input signals, each of said logic trees having a first common node coupled to a corresponding one of said plurality of dynamic nodes and a second common node.

7. The logic device of claim 6, wherein each of said plurality of dynamic logic circuits comprises an NFET having a gate coupled to said clock signal, a drain coupled to said second common node and a source coupled to said second power supply voltage.

8. The logic device of claim 1, wherein a size of a precharge device for precharging each of said plurality of dynamic nodes is selected corresponding to the duration of said second phase of said clock signal.

9. A logic system comprising:
 a first logic device, said first logic device including a plurality of first dynamic logic circuits, each of said plurality of first dynamic logic circuits generating a first logic output on a first dynamic node thereby forming a plurality of said first dynamic nodes with a plurality of said first logic outputs, each of said plurality of first dynamic nodes precharged to a first logic value during a first phase of a first clock signal and evaluated to a second logic value corresponding to a first Boolean combination of a plurality of first logic input signals during a second phase of said first clock signal, said first logic device further including a first static logic circuit receiving said plurality of first logic outputs and generating a second logic output at a first output node having a third logic value corresponding to a second Boolean combination of said plurality of first logic outputs during said second phase of said first clock signal, said first static logic circuit further maintaining said third logic value during said first phase of said first clock signal; and
 a second logic device, said second logic device including a plurality of second dynamic logic circuits, each of said plurality of second dynamic logic circuits generating a third logic output on a second dynamic node thereby forming a plurality of said second dynamic nodes with a plurality of said third logic outputs, each of said plurality of second dynamic nodes precharged to a fourth logic value during a first phase of a second clock signal and evaluated to a fifth logic value corresponding to a third Boolean combination of a plurality of second logic input signals during a second phase of said second clock signal, wherein one of said plurality of second logic input signals is derived from an output of said first logic device, said second logic device further including a second static logic circuit receiving said plurality of third logic outputs and generating a fourth logic output at a second output node having a sixth logic value corresponding to a fourth Boolean combination of said plurality of third logic outputs during said second phase of said second clock signal, said second static logic circuit further maintaining said sixth logic value during said first phase of said second clock signal, and wherein each of said first and second phases of the second clock signal has a predetermined phase shift relative to a respective one of said first and second phases of the first clock signal.

10. The logic system of claim 9, wherein said predetermined phase shift is π radians and wherein a respective duration of the first phase of said first and second clock signals is less than a respective duration of the second phase of the first and second clock signals.

11. The logic system of claim 9, wherein said first static logic circuit generates a fifth logic output at a third output node having a seventh logic value corresponding to the complement of said sixth logic value during said second phase of said first clock signal and wherein said first static logic circuit maintains said seventh logic value during said first phase of said first clock signal.

12. The logic system of claim 11, wherein said first static logic circuit comprises:
a static complementary logic gate having said first output node generating said second logic output, a plurality of input nodes, each of said plurality of input nodes coupled to a corresponding one of said plurality of first logic outputs, a power supply node coupled to a first power supply voltage and a ground node coupled to a first common node of parallel coupled first and second N-channel field effect transistors (NFETs), a second common node of said parallel coupled first and second NFETs coupled to a second power supply voltage, a gate of said first NFET coupled to said first clock signal and a gate of said second NFET coupled to said third output node.

13. The logic system of claim 12 further including an inverter, an input of said inverter coupled to said first output node, an output of the inverter forming said third output node, and wherein a gate of a P-channel field effect transistor (PFET) is coupled to said output of said inverter, a source of said PFET is coupled to said power supply voltage and a drain of said PFET is coupled to said first output node.

14. The logic system of claim 9, wherein each of said plurality of first dynamic logic circuits includes a PFET having a gate coupled to said first clock signal, a drain coupled to a first power supply voltage and a source coupled to said first dynamic node, and an NFET having a gate coupled to said first clock signal, a drain coupled to said second common node and a source coupled to said second power supply voltage.

15. The logic system of claim 9, wherein each of said plurality of first dynamic logic circuits comprises a logic tree thereby forming a plurality of logic trees, each of said plurality of logic trees receiving a plurality of said first logic inputs and performing said first Boolean combination on said plurality of first logic inputs, each of said logic trees having a first common node coupled to a corresponding one of said plurality of first dynamic nodes and a second common node.

16. A data processing system comprising:
a central processing unit (CPU);
a memory operable for communicating instructions and operand data to said CPU, wherein said CPU includes a logic system having a first logic device, said first logic device including a plurality of first dynamic logic circuits, each of said plurality first dynamic logic circuits generating a first logic output on a first dynamic node thereby forming a plurality of said first dynamic nodes with a plurality of said first logic outputs, each of said plurality of first dynamic nodes precharged to a first logic value during a first phase of a first clock signal and evaluated to a second logic value corresponding to a first Boolean combination of a plurality of first logic input signals during a second phase of said first clock signal, said first logic device further including a first static logic circuit receiving said plurality of first logic outputs and generating a second logic output at a first output node having a third logic value corresponding to a second Boolean combination of said plurality of first logic outputs during said second phase of said first clock signal, said first static logic circuit further maintaining said third logic value during said first phase of said first clock signal; and
a second logic device, said second logic device including a plurality of second dynamic logic circuits, each of said plurality of second dynamic logic circuits generating a third logic output on a second dynamic node thereby forming a plurality of said second dynamic nodes with a plurality of said third logic outputs, each of said plurality of second dynamic nodes precharged to a fourth logic value during a first phase of a second clock signal and evaluated to a fifth logic value corresponding to a third Boolean combination of a plurality of second logic input signals during a second phase of said second clock signal, wherein one of said plurality of second logic input signals is derived from an output of said first logic device, said second logic device further including a second static logic circuit receiving said plurality of third logic outputs and generating a fourth logic output at a second output node having a sixth logic value corresponding to a fourth Boolean combination of said plurality of third logic outputs during said second phase of said second clock signal, said second static logic circuit further maintaining said sixth logic value during said first phase of said second clock signal, and wherein each of said first and second phases of the second clock signal has a predetermined phase shift relative to a respective one of said first and second phases of the first clock signal, and wherein a respective duration of the first phase of said first and second clock signals is less than a respective duration of the second phase of the first and second clock signals.

17. The data processing system of claim 16 further comprising a third logic device, said third logic device including a plurality of third dynamic logic circuits, each of said plurality of third dynamic logic circuits receiving a third clock signal, a plurality of third logic input signals, each of said plurality of third dynamic logic circuits generating a fifth logic output on a third dynamic node thereby forming a plurality of said third dynamic nodes with a plurality of said fifth logic outputs, each of said plurality of third dynamic nodes precharged to a seventh logic value during a first phase of said third clock signal and evaluated to an eighth logic value corresponding to a fifth Boolean combination of corresponding of said plurality of third logic input signals during a second phase of said third clock signal, said second logic device further including a third static logic circuit receiving said plurality of fifth logic outputs and generating a sixth logic output at a third output node having a ninth logic value corresponding to a sixth Boolean combination of said plurality of fifth logic outputs during said second phase of said third clock signal, said third static logic circuit further maintaining said ninth logic value during said first phase of said third clock signal, and wherein each of said first and second phases of the third clock signal has a predetermined phase shift relative to a respective one of said first and second phases of the first clock signal, and wherein a respective duration of the first phase of said first and third clock signals is less than a respective duration of the second phase of the first and third clock signals.

18. The data processing system of claim 16, wherein said CPU further comprises an arithmetic logic unit, and wherein said arithmetic logic unit includes said logic system.

19. The data processing system of claim 18, wherein said arithmetic logic unit further comprises a fourth logic device selected from the group consisting of a static inverter, a gain stage and a static logic gate, said fourth logic device disposed between said second and third logic devices, an output of said fourth logic device comprising one of said plurality of third input signals of said third logic device.

20. The data processing system of claim 16, wherein said first static logic circuit generates a fifth logic output at a third output node having a seventh logic value corresponding to the complement of said third logic value during said second phase of said first clock signal and wherein said first static logic circuit maintains said seventh logic value during said first phase of said first clock signal.

21. The data processing system of claim 20, wherein said first static logic circuit comprises:

a static complementary logic gate having said first output node generating said second logic output, a plurality of input nodes, each of said plurality of input nodes coupled to a corresponding one of said plurality of first logic outputs, a power supply node coupled to a first power supply voltage and a ground node coupled to a first common node of parallel coupled first and second N-channel field effect transistors (NFETs), a second common node of said parallel coupled first and second NFETs coupled to a second power supply voltage, a gate of said first NFET coupled to said first clock signal and a gate of said second NFET coupled to said third output node.

22. The data processing system of claim 21 further including an inverter, an input of said inverter coupled to said first output node, an output of the inverter forming said third output node, and wherein a gate of a PFET is coupled to said output of said inverter, a source of said PFET is coupled to said power supply voltage and a drain of said PFET is coupled to said first output node.

23. The data processing system of claim 16, wherein each of said plurality of first dynamic logic circuits includes a PFET having a gate coupled to said first clock signal, a drain coupled to a first power supply voltage and a source coupled to said first dynamic node and an NFET having a gate coupled to said first clock signal, a drain coupled to said second common node and a source coupled to said second power supply voltage.

24. The data processing system of claim 16, wherein each of said plurality of first dynamic logic circuits comprises a logic tree thereby forming a plurality of logic trees, each of said plurality of logic trees receiving a corresponding plurality of first logic inputs and performing said first Boolean combination on said corresponding plurality of first logic inputs, each of said logic trees having a first common node coupled to a corresponding one of said plurality of first dynamic nodes and a second common node.

* * * * *